(12) United States Patent
Ho et al.

(10) Patent No.: US 9,153,707 B2
(45) Date of Patent: Oct. 6, 2015

(54) CHIP PACKAGE AND METHOD FOR FORMING THE SAME

(71) Applicant: XINTEC INC., Jhongli, Taoyuan County (TW)

(72) Inventors: Yen-Shih Ho, Kaohsiung (TW); Ying-Nan Wen, Hsinchu (TW); Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 13/912,792

(22) Filed: Jun. 7, 2013

(65) Prior Publication Data

US 2013/0328147 A1 Dec. 12, 2013

Related U.S. Application Data (60) Provisional application No. 61/658,024, filed on Jun. 11, 2012.

(51) Int. Cl.
| | |
|---|---|
| *H01L 31/0232* | (2014.01) |
| *H01L 31/02* | (2006.01) |
| *H01L 27/146* | (2006.01) |

(52) U.S. Cl.
CPC .... *H01L 31/02002* (2013.01); *H01L 27/14618* (2013.01); *H01L 27/14621* (2013.01); *H01L 27/14627* (2013.01); *H01L 27/14632* (2013.01); *H01L 27/14636* (2013.01); *H01L 27/14687* (2013.01); *H01L 31/0232* (2013.01); *H01L 2924/0002* (2013.01)

(58) Field of Classification Search
CPC .............. H01L 31/02002; H01L 31/0232; H01L 27/14636; H01L 27/14618; H01L 27/14621; H01L 27/14627; H01L 27/14632; H01L 27/14687

See application file for complete search history.

(56) References Cited

U.S. PATENT DOCUMENTS

| | | | | |
|---|---|---|---|---|
| 2007/0114629 | A1* | 5/2007 | Dosluoglu et al. | 257/435 |
| 2008/0237766 | A1* | 10/2008 | Kim | 257/432 |
| 2008/0296577 | A1* | 12/2008 | Yuan et al. | 257/59 |
| 2010/0244173 | A1* | 9/2010 | Wang et al. | 257/435 |
| 2011/0049336 | A1* | 3/2011 | Matsunuma | 250/214.1 |

FOREIGN PATENT DOCUMENTS

| | | |
|---|---|---|
| TW | 200727465 A | 7/2007 |
| TW | 201113992 A | 4/2011 |
| TW | 201131710 A | 9/2011 |
| TW | 201133731 A | 10/2011 |

* cited by examiner

*Primary Examiner* — Fei Fei Yeung Lopez
(74) *Attorney, Agent, or Firm* — Liu & Liu (57) ABSTRACT

An embodiment of the invention provides a chip package which includes: a semiconductor substrate having a first surface and a second surface; a device region disposed in the semiconductor substrate; a dielectric layer disposed on the first surface of the semiconductor substrate; a conducting pad structure disposed in the dielectric layer and electrically connected to the device region, a carrier substrate disposed on the dielectric layer; and a conducting structure disposed in a bottom surface of the carrier substrate and electrically contacting with the conducting pad structure.

20 Claims, 6 Drawing Sheets

CHIP PACKAGE AND METHOD FOR FORMING THE SAME

CROSS REFERENCE TO RELATED APPLICATIONS

This application claims the benefit of U.S. Provisional Application No. 61/658,024, filed on Jun. 11, 2012, the entirety of which is incorporated by reference herein.

BACKGROUND OF THE INVENTION

1. Field of the Invention

The invention relates to a chip package, and in particular, relates to a chip package formed by using a wafer-level packaging process.

2. Description of the Related Art

The packaging process of chip packages is one important step in forming electronic products. A chip package not only provides protection for the chips from environmental contaminants, but also provides a connection interface for internal electronic elements and chips packaged therein.

Because the conventional chip packaging process is still too complicated, it is desired to have a simplified chip packaging process

BRIEF SUMMARY OF THE INVENTION

An embodiment of the invention provides a chip package which includes a semiconductor substrate having a first surface and a second surface; a device region disposed in the semiconductor substrate; a dielectric layer disposed on the first surface of the semiconductor substrate; a conducting pad structure disposed in the dielectric layer and electrically connected to the device region; a carrier substrate disposed on the dielectric layer; and a conducting structure disposed in a bottom surface of the carrier substrate and electrically contacting with the conducting pad structure.

An embodiment of the invention provides a chip package which includes: a semiconductor substrate having a first surface and a second surface; a device region disposed in the semiconductor substrate; a dielectric layer disposed on the first surface of the semiconductor substrate; a conducting pad structure disposed in the dielectric layer and electrically connected to the device region, wherein a lower surface of the dielectric layer is a substantially planar surface and completely covers the conducting pad structure; and a conducting structure disposed on the second surface of the semiconductor substrate and electrically connected to the conducting pad structure.

An embodiment of the invention provides a method for forming a chip package which includes: providing a semiconductor substrate having a first surface and a second surface, wherein a device region is formed in the semiconductor substrate; disposing a dielectric layer and a conducting pad structure on the first surface of the semiconductor substrate, wherein the conducting pad structure is located in the dielectric layer and completely covered by the dielectric layer; forming an insulating layer on the second surface of the semiconductor substrate; and forming a conducting structure on the second surface of the semiconductor substrate, wherein the conducting structure electrically contacts with the conducting pad structure, and the conducting structure is separated from the semiconductor substrate by the insulating layer.

An embodiment of the invention provides a method for forming a chip package which includes: providing a semiconductor substrate having a first surface and a second surface, wherein a device region is formed in the semiconductor substrate; disposing a dielectric layer and a conducting pad structure on the first surface of the semiconductor substrate, wherein the conducting pad structure is located in the dielectric layer and completely covered by the dielectric layer; bonding a carrier substrate on the dielectric layer; and forming a conducting structure on a lower surface of the carrier substrate, wherein the conducting structure electrically contacts with the conducting pad structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of chips. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may be only slightly larger than the size of the packaged chip. For example, the size of the chip package is not larger than 120% of the size of the packaged chip.

Figure 1A:
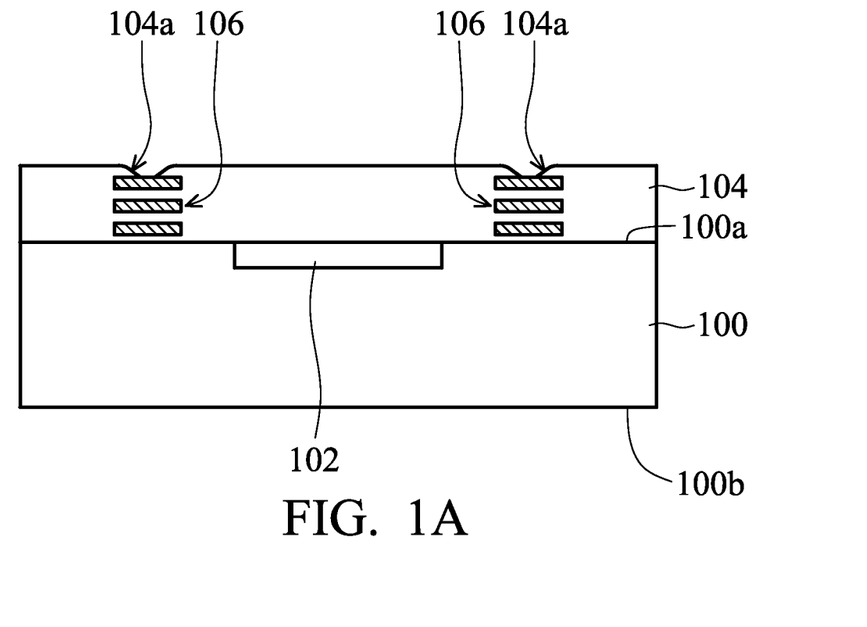
FIG. 1A is a cross-sectional view showing a chip package according to an embodiment of the present invention.

FIG. 1A is a cross-sectional view showing a chip package according to an embodiment of the present invention, which is, for example, a front-side illuminated image sensor chip package. The chip package may include a semiconductor substrate 100 which has a surface 100a and a surface 100b. A device region 102 may be disposed and/or formed in the semiconductor substrate 100. The device region 102 may include a variety of active elements and/or passive elements. In one embodiment, the device region 102 may include an image sensor device which is used for sensing light, which penetrates through a dielectric layer 104 and reaching the device region 102.

The dielectric layer 104 may be formed on the surface 100a of the semiconductor substrate 100, and at least one conducting pad structure 106 may be formed therein. In one embodiment, a portion of the dielectric layer 104 is removed by using a photolithography process and an etching process to form an opening 104a exposing the conducting pad structure 106. In one embodiment, a bonding wire may be formed on the conducting pad structure 106 exposed by the opening 104a by using, for example, a wire bonding process. In the embodiment shown in FIG. 1A, a patterning process is needed to expose the conducting pad structure 106 and a relatively large space is occupied by the bonding wire, which limits shrinkage of the chip package. In one embodiment, a probe testing process may be performed through the opening 104a exposing the conducting pad structure 106.

Figure 1B:
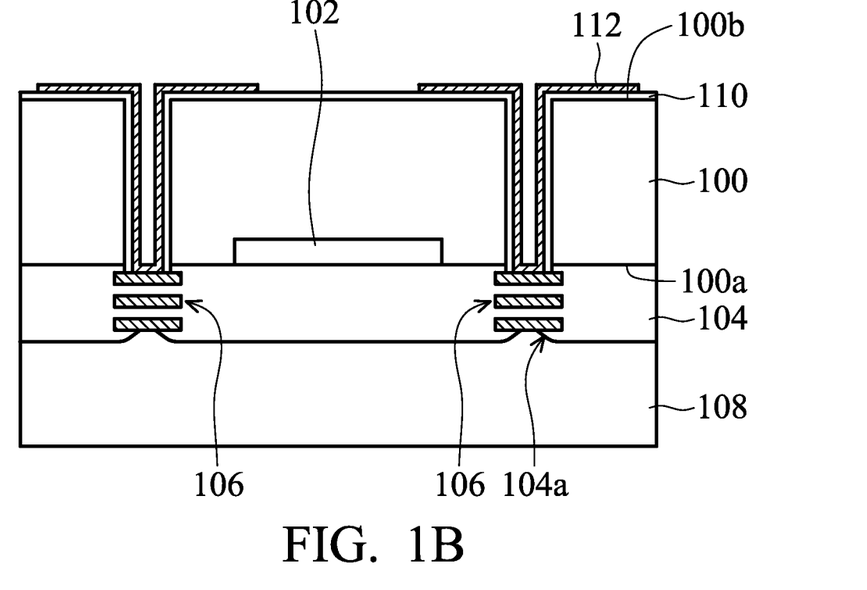
FIG. 1B is a cross-sectional view showing a chip package according to an embodiment of the present invention.

FIG. 1B is a cross-sectional view showing a chip package according to another embodiment of the present invention, which is, for example, a backside illuminated image sensor chip package. The chip package may include a semiconductor substrate 100 which has a surface 100a and a surface 100b. A device region 102 may be disposed and/or formed in the semiconductor substrate 100. The device region 102 may include a variety of active elements and/or passive elements. In one embodiment, the device region 102 may include an image sensor device which is used for sensing light, which penetrates through the surface 100b of the semiconductor substrate 100 and reaching the device region 102.

A dielectric layer 104 may be formed on the surface 100a of the semiconductor substrate 100, and at least one conducting pad structure 106 may be formed therein. In one embodiment, a portion of the dielectric layer 104 is removed by using a photolithography process and an etching process to form an opening 104a exposing the conducting pad structure 106. A carrier substrate 108 may be bonded on the dielectric layer 104. In one embodiment, the carrier substrate 108 may be used as a support substrate, and the semiconductor substrate 100 is thinned from the surface 100b. Then, a portion of the semiconductor substrate 100 may be removed from the surface 100b of the semiconductor substrate 100 to form a hole exposing the conducting pad structure 106. Then, an insulating layer 110 and a patterned conducting layer 112 may be formed on the surface 100b in turn. The conducting layer 112 may extend into the hole to electrically contact with the conducting pad structure 106. In the embodiment shown in FIG. 1B, a patterning process is needed to form the opening 104a and a portion of the surface 100b is covered by the hole and the conducting layer 112. Thus, when an optical element (such as a light filter film, a microlens, or combinations thereof) is disposed on the device region 102, both the available position and disposing process of the optical element are limited.

Alternatively, in another embodiment, the carrier substrate 108 is not disposed, and the through substrate conducting structure including the conducting layer 112 is not formed. In this case, a wire bonding process may be performed in the opening 104a exposing the conducting pad structure 106 to form a bonding wire electrically connected to the device region 102. Alternatively, a probe testing process may be performed through the opening 104a exposing the conducting pad structure 106.

In the embodiments mentioned above, a photolithography process and an etching process are needed to form the opening 104a exposing the conducting pad structure 106 in the dielectric layer 104, which increases fabrication cost and time.

In order to reduce and/or resolve the problems encountered in the embodiments mentioned above, the disclosure provides other embodiments in the following descriptions.

Figure 2A:
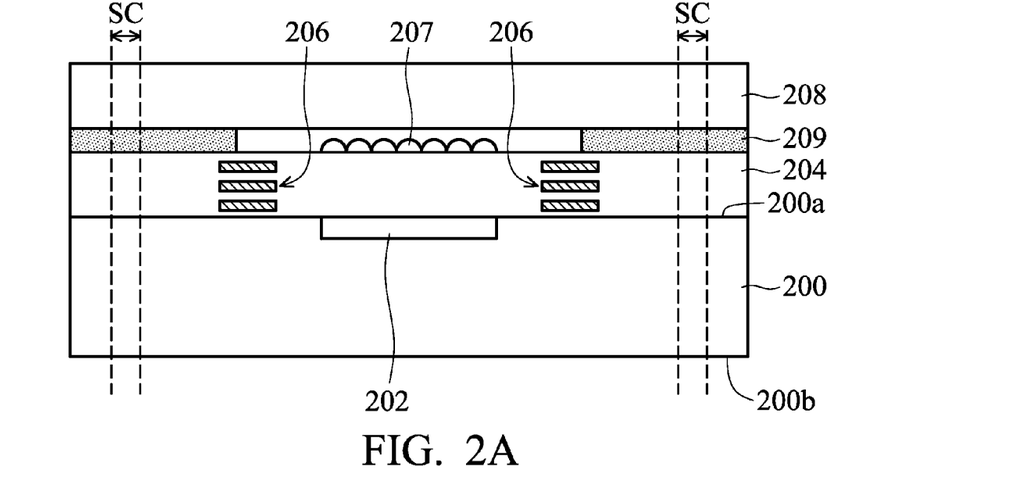
FIGS. 2A-2D are cross-sectional views showing the steps of forming a chip package according to an embodiment of the present invention.

FIGS. 2A-2D are cross-sectional views showing the steps of forming a chip package according to an embodiment of the present invention, wherein the packaged chip is, for example, (but is not limited to) an image sensor chip. As shown in FIG. 2A, a semiconductor substrate 200 is provided, which may be, for example, a semiconductor wafer. A plurality of predetermined scribe lines SC may be defined in the semiconductor substrate 200, which divide the semiconductor substrate 200 into a plurality of die regions. In one embodiment, a plurality of device regions 202 may be formed and/or disposed in the semiconductor substrate 200. The device region 202 may include a variety of active elements, passive elements, or combinations thereof.

A dielectric layer 204 and a plurality of conducting pad structures 206 may be formed on the surface 200a of the semiconductor substrate 200. The conducting pad structures 206 may be, for example, arranged along the predetermined scribe lines SC. The conducting pad structure 206 may also be electrically connected to elements in the device region 202. In this embodiment, no additional patterning process is performed to remove a portion of the dielectric layer 204 such that the conducting pad structure 206 is exposed. That is, in this embodiment, a portion of the dielectric layer 204 is not removed from a surface of the dielectric layer 204 which is away from the semiconductor substrate 200 such that the conducting pad structure 206 is exposed. Thus, cost and time required for one patterning process may be saved. In addition, the surface of the dielectric layer 204 has no opening exposing the conducting pad structure 206 and is a substantially planar surface, which is helpful for the subsequent forming and/or disposing of a variety of required elements on the surface of the dielectric layer 204.

For example, as shown in FIG. 2A, in one embodiment, an optical element 207 may be disposed on the substantially planar surface of the dielectric layer 204. The optical element 207 may include a light filter film (such as a color filter film), a microlens, or combinations thereof. The process may be simplified and time may be significantly reduced since the optical element 207 is disposed on the substantially planar surface of the dielectric layer 204.

In one embodiment, a transparent substrate 208 may be optionally disposed on the surface 200a of the semiconductor substrate 200. The transparent substrate 208 may be disposed on the semiconductor substrate 200 and the optical element 207 through, for example, a spacer layer 209 disposed between the transparent substrate 208 and the semiconductor substrate 200. In one embodiment, the spacer layer 209 surrounds the optical element 207, and surrounds, together with the transparent substrate 208 and the dielectric layer 204, a substantially closed cavity on the device region 202.

Figure 2B:
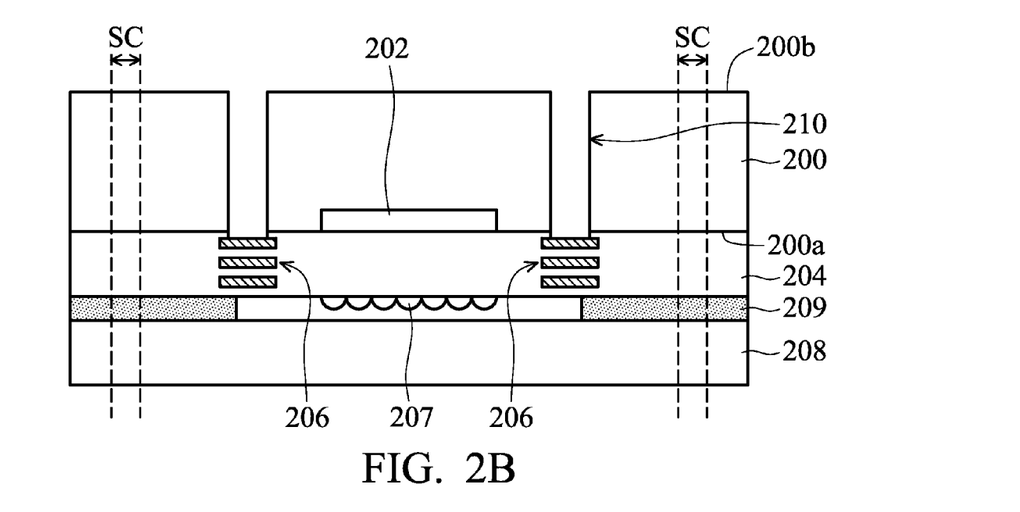

Next, as shown in FIG. 2B, the transparent substrate 208 may be used as a support substrate to facilitate subsequent processes. In one embodiment, the semiconductor substrate 200 may be optionally thinned from the surface 200b of the semiconductor substrate 200. A suitable thinning process includes, for example, a mechanical grinding process, a chemical mechanical polishing process, an etching process, or combinations thereof.

Then, a portion of the semiconductor substrate 200 may be removed from the surface 200b to form a hole 210 extending towards the surface 200a by using a patterning process (such as photolithography and etching processes, a laser drilling process, a physical drilling process, or combinations thereof). In one embodiment, the hole 210 may align with the conducting pad structure 206 and extend through the dielectric layer 204 to expose the conducting pad structure 206.

Figure 2C:
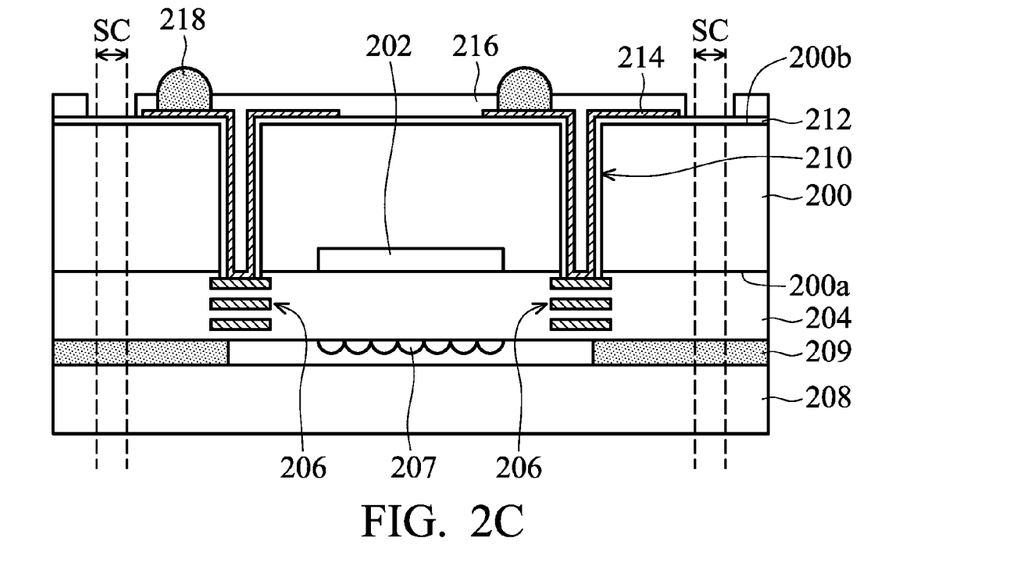

As shown in FIG. 2C, an insulating layer 212 may be formed on the surface 200b of the semiconductor substrate 200. The insulating layer 212 may be extended on a sidewall and a bottom of the hole 210. Then, the insulating layer 212 on the bottom of the hole 210 may be removed such that the conducting pad structure 206 is exposed. In another embodiment, the hole 210 does not expose the conducting pad structure 206 but only expose the dielectric layer 204 directly above the conducting pad structure 206. In this case, after the insulating layer 212 is formed, the insulating layer 212 and the dielectric layer 204 at the bottom of the hole 210 may be removed during the same patterning process such that the conducting pad structure 206 is exposed.

Then, a patterned conducting layer 214 may be formed on the insulating layer 212 on the surface of the semiconductor substrate 200. The conducting layer 214 may extend into the hole 210 to electrically contact with the exposed conducting pad structure 206. Then, a patterned protection layer 216 and a conducting bump 218 electrically connected to the conducting layer 214 may be formed.

Figure 2D:
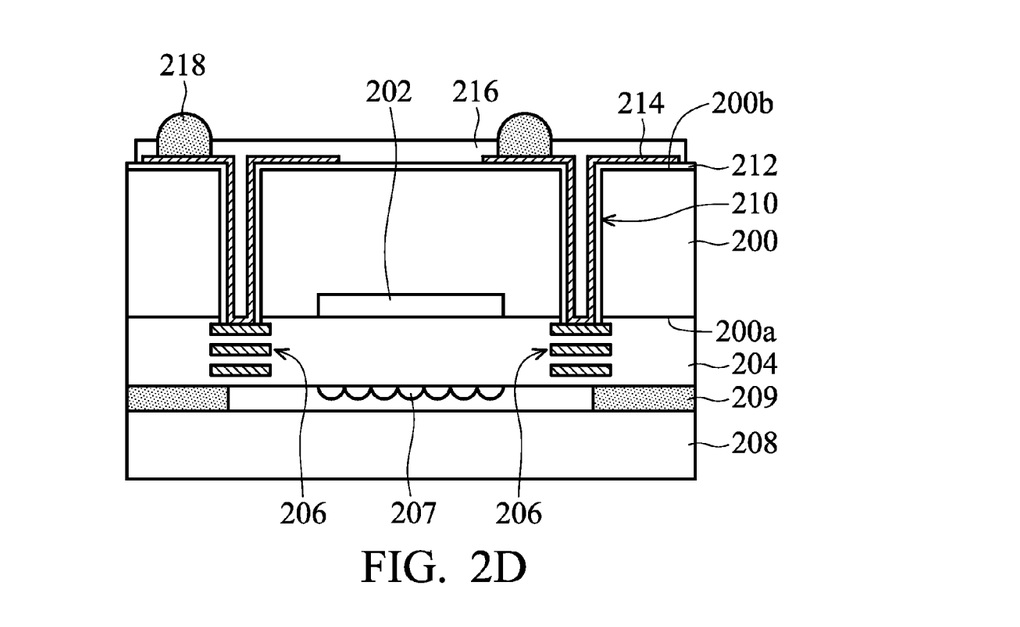

As shown in FIG. 2D, a dicing process may be performed along the predetermined scribe lines SC to form a plurality of chip packages separated from each other, wherein the conducting bump 218 and the conducting layer 214 may together serve as a conducting structure electrically connected to the conducting pad structure 206. Compared with the embodiment shown in FIG. 1A, it is not required to form an opening exposing the conducting pad structure in the embodiment shown in FIG. 2 such that the dielectric layer 204 has a substantially planar lower surface, facilitating the subsequent process step of forming the optical element 207. In addition, for the chip package of the embodiment shown in FIG. 2, electrical connections may still be formed between the through substrate conducting structure including the conducting layer 214 and the device region 202, and a probe testing process may also be performed.

In addition, it should be appreciated that although the conducting structure of the embodiment shown in FIG. 2 includes a through substrate conducting structure, embodiments of the invention are not limited thereto. In another embodiment, the conducting structure may be extended on a side surface of the semiconductor substrate 200 to form a T-type contact or an L-type contact with the conducting pad structure. In yet another embodiment, recesses may be formed at locations of the predetermined scribe lines SC, wherein the recesses are connected with the holes 210. Thus, the deposition process of subsequent material layers may be improved.

Figure 3A:
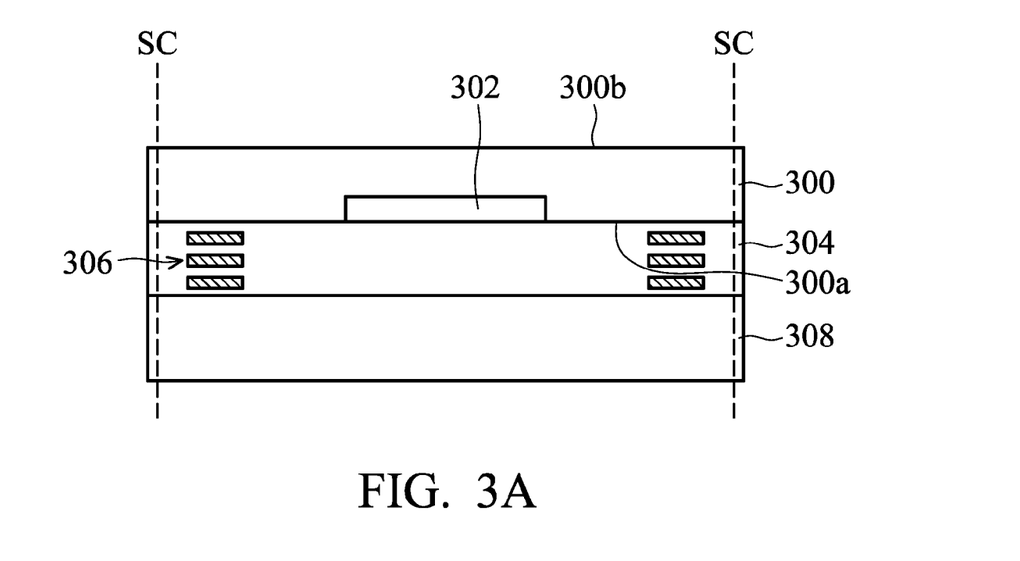
FIGS. 3A-3E are cross-sectional views showing the steps of forming a chip package according to an embodiment of the present invention.

FIGS. 3A-3E are cross-sectional views showing the steps of forming a chip package according to another embodiment of the present invention, wherein the packaged chip is, for example, (but is not limited to) an image sensor chip. As shown in FIG. 3A, a semiconductor substrate 300 is provided, which is, for example, a semiconductor wafer. A plurality of predetermined scribe lines SC may be defined in the semiconductor substrate 300, which divide the semiconductor substrate 300 into a plurality of die regions. In one embodiment, a plurality of device regions 302 may be formed and/or disposed in the semiconductor substrate 300.

A dielectric layer 304 and a plurality of conducting pad structures 306 may be formed on the surface 300a of the semiconductor substrate 300. The conducting pad structure 306 may be electrically connected to elements in the device region 302. In this embodiment, no additional patterning process is performed to remove a portion of the dielectric layer 304 such that the conducting pad structure 306 is exposed. That is, in this embodiment, a portion of the dielectric layer 304 is not removed from a surface of the dielectric layer 304 which is away from the semiconductor substrate 300 such that the conducting pad structure 306 is exposed in this stage. Thus, cost and time required for one patterning process may be saved.

In one embodiment, a carrier substrate 308 may be optionally bonded onto a lower surface of the dielectric layer 304. The carrier substrate 308 may be a semiconductor substrate such as a silicon wafer. In another embodiment, the carrier substrate 308 may be an insulating substrate such as a ceramic substrate, a polymer substrate, or combinations thereof. Because it is not needed to form an opening exposing the conducting pad structure 306 on the lower surface of the dielectric layer 304, it may be easier to bond the carrier substrate 308 on the dielectric layer 304. Then, the carrier substrate 308 may be optionally used as a support substrate, and the semiconductor substrate 300 may be thinned from the surface 300b of the semiconductor substrate 300. In one embodiment, the image sensor chip package to be formed is a backside illuminated type image sensor chip package. In this case, the thinned semiconductor substrate 300 may allow more light to penetrate through the semiconductor substrate 300 to reach the device region 302.

Figure 3B:
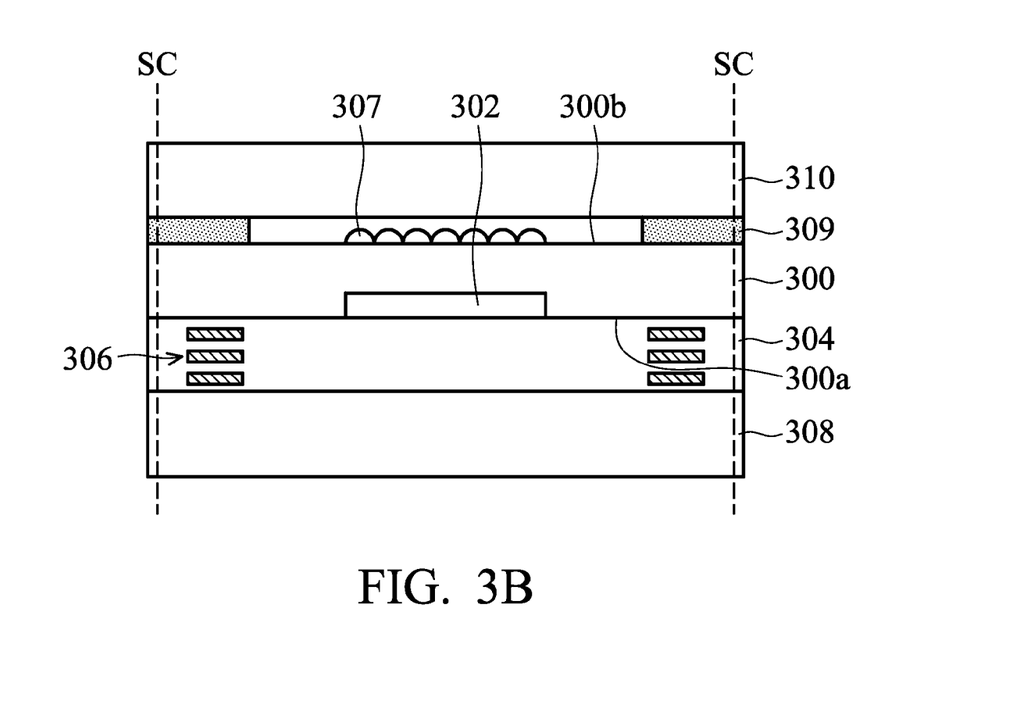

Next, as shown in FIG. 3B, an optical element 307 may be optionally formed and/or disposed in the substantially planar surface 300b of the semiconductor substrate 300. The optical element 307 may include, for example, a light filter film (such as a color filter film), a microlens, or combinations thereof. In one embodiment, no recess or hole is formed at the surface 300b of the semiconductor substrate 300, and the fabrication process of the optical element 307 is simplified. However, embodiments of the invention are not limited thereto. In another embodiment, an alignment opening for assisting alignment may be formed at the locations of the predetermined scribe lines SC, depending on requirements.

In one embodiment, a transparent substrate 310 may be optionally disposed on the surface 300a of the semiconductor substrate 300. The transparent substrate 310 may be disposed on the semiconductor substrate 300 and the optical element 307 through, for example, a spacer layer 309 disposed between the transparent substrate 310 and the semiconductor substrate 300. In one embodiment, the spacer layer 309 surrounds the optical element 307, and surrounds, together with the transparent substrate 310 and the semiconductor substrate 300, a substantially closed cavity on the device region 302.

Figure 3C:
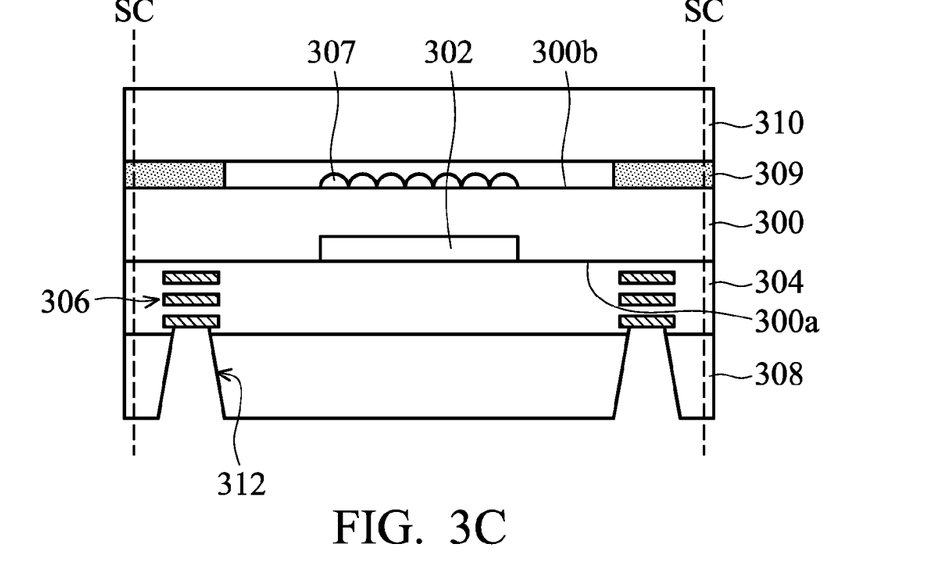

Next, as shown in FIG. 3C, a portion of the carrier substrate 308 may be removed from a surface of the carrier substrate 308 to form a hole 312 extending towards the semiconductor substrate 300 by using a patterning process (such as photolithography and etching processes, a laser drilling process, a physical drilling process, or combinations thereof). In one embodiment, the hole 312 may align with the conducting pad structure 306 and extend through the dielectric layer 304 to expose the conducting pad structure 306.

Figure 3D:
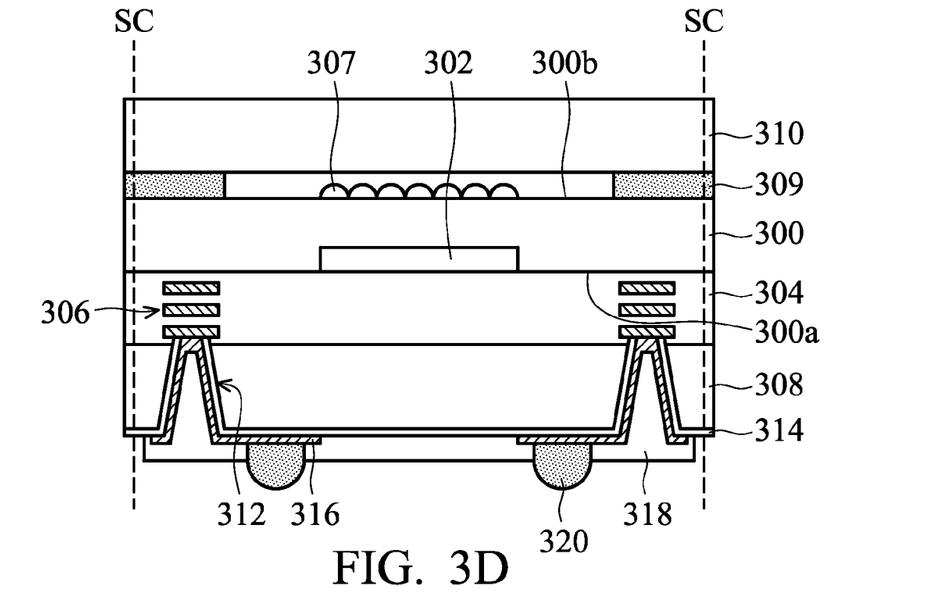

As shown in FIG. 3D, an insulating layer 314 may be formed on the surface of the carrier substrate 308. The insulating layer 314 may be extended on a sidewall and a bottom of the hole 312. Then, the insulating layer 314 on the bottom of the hole 312 may be removed such that the conducting pad structure 306 is exposed. In another embodiment, the hole 312 does not expose the conducting pad structure 306 and only expose the dielectric layer 304 directly above the conducting pad structure 306. In this case, after the insulating layer 314 is formed, the insulating layer 314 and the dielectric layer 304 at the bottom of the hole 312 may be removed during the same patterning process such that the conducting pad structure 306 is exposed.

Then, a patterned conducting layer 316 may be formed on the insulating layer 314 on the surface of the carrier substrate 308. The conducting layer 316 may extend into the hole 312 to electrically contact with the exposed conducting pad structure 306. It should be appreciated that the formation of the insulating layer 314 is not necessary. For example, if the carrier substrate 308 is an insulating substrate, the insulating layer 314 may not need to be formed. Then, a patterned protection layer 318 and a conducting bump 320 electrically connected to the conducting layer 316 may be formed.

Figure 3E:
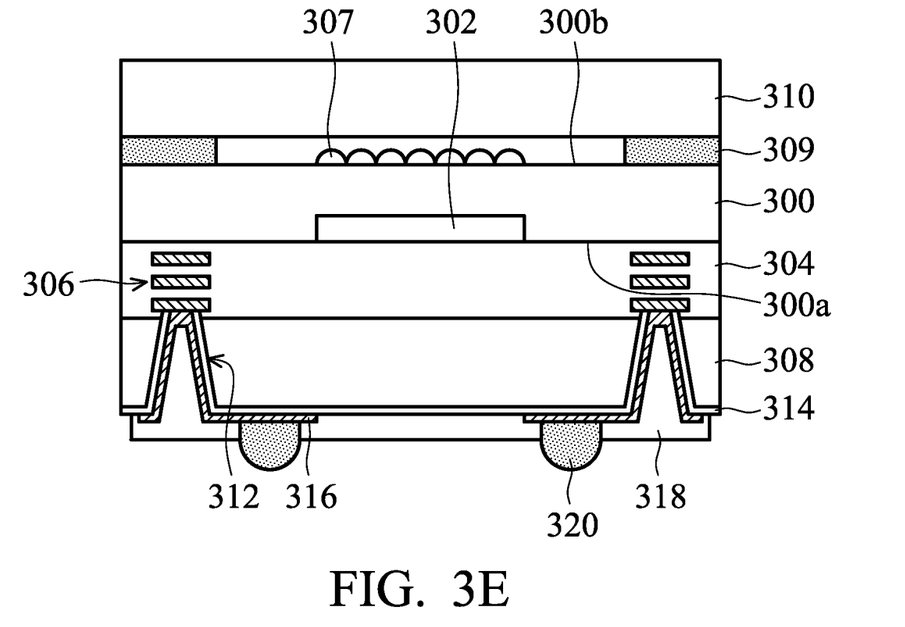

As shown in FIG. 3E, a dicing process may be performed along the predetermined scribe lines SC to form a plurality of chip packages separated from each other, wherein the conducting bump 320 and the conducting layer 316 may together serve as a conducting structure electrically connected to the conducting pad structure. Compared with the embodiment shown in FIG. 1B, it is not required to form an opening exposing the conducting pad structure in the embodiment shown in FIG. 3 such that the dielectric layer 304 has a substantially planar lower surface, facilitating the subsequent process step for bonding with the carrier substrate 308.

In addition, in the embodiment shown in FIG. 3E, the conducting structure electrically connected to the conducting pad structure is formed in the carrier substrate 308 but not in the semiconductor substrate 300. Thus, the space for disposition for a variety of elements in the semiconductor substrate 300 is increased. In addition, because the fabrication process for forming the conducting structure is performed in the carrier substrate 308, the elements in the semiconductor substrate 300 may be prevented from being damaged due to the fabrication process of the conducting structure. The reliability of the chip package may thus be improved.

In addition, for the chip package of the embodiment shown in FIG. 3, electrical connections may still be formed between the through substrate conducting structure including the conducting layer 316 and the device region 302, and a probe testing process may also be performed.

In addition, it should be appreciated that although the conducting structure of the embodiment shown in FIG. 3 includes a through substrate conducting structure, embodiments of the invention are not limited thereto. In another embodiment, the conducting structure may be extended on a side surface of the carrier substrate 308 to form a T-type contact or an L-type contact with the conducting pad structure. In yet another embodiment, recesses may be formed at locations corresponding to the predetermined scribe lines SC on the carrier substrate 308, wherein the recesses are connected with the holes 312. Thus, the deposition process of subsequent material layers may be improved.

In the embodiments of the present invention, the number of patterning processes may be significantly decreased, and the process difficulty of forming the optical element is reduced. The fabrication cost and time may be reduced, and the reliability of the chip package may be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising;
   a semiconductor substrate having a first surface and a second surface;
   a device region disposed in the semiconductor substrate;
   a dielectric layer disposed on the first surface of the semiconductor substrate;
   a conducting pad structure disposed in the dielectric layer and electrically connected to the device region, wherein a lower surface of the dielectric layer is a substantially planar surface and completely covers the conducting pad structure;
   an optical element disposed on the lower surface of the dielectric layer; and
   a conducting structure disposed on the second surface of the semiconductor substrate and electrically connected to the conducting pad structure, wherein the conducting pad structure is adjacent to an edge of the semiconductor substrate and outside the device region when viewed in a direction orthogonal to the first surface.

2. The chip package as claimed in claim 1, wherein the optical element comprises a light filter film, a microlens, or combinations thereof.

3. The chip package as claimed in claim 1, further comprising a transparent substrate disposed on the lower surface of the dielectric layer.

4. The chip package as claimed in claim 3, further comprising a spacer layer disposed between the lower surface of the dielectric layer and the transparent substrate.

5. The chip package as claimed in claim 1, further comprising a hole located in the semiconductor substrate, wherein the hole exposes the conducting pad structure, the conducting structure extends into the hole to electrically contact with the conducting pad structure, and the conducting structure is separated from the semiconductor substrate by an insulating layer.

6. A method for forming a chip package, comprising:
   providing a semiconductor substrate having a first surface and a second surface, wherein a device region is formed in the semiconductor substrate;
   disposing a dielectric layer and a conducting pad structure on the first surface of the semiconductor substrate, wherein the conducting pad structure is located in the dielectric layer and completely covered by a lower surface of the dielectric layer;

disposing an optical element on the lower surface of the dielectric layer;

forming an insulating layer on the second surface of the semiconductor substrate; and forming a conducting structure on the second surface of the semiconductor substrate, wherein the conducting structure electrically contacts with the conducting pad structure, and the conducting structure is separated from the semiconductor substrate by the insulating layer, and wherein the conducting pad structure is adjacent to an edge of the semiconductor substrate and outside the device region when viewed in a direction orthogonal to the first surface.

7. The method for forming a chip package as claimed in claim 6, not comprising removing a portion of the dielectric layer from a surface of the dielectric layer away from the semiconductor substrate such that the conducting pad structure is exposed.

8. A chip package, comprising:
a semiconductor substrate having a first surface and a second surface;
a device region disposed in the semiconductor substrate;
a dielectric layer disposed on the first surface of the semiconductor substrate;
a conducting pad structure disposed in the dielectric layer and electrically connected to the device region, wherein a lower surface of the dielectric layer is a substantially planar surface and completely covers the conducting pad structure;
an optical element disposed on the lower surface of the dielectric layer;
a hole located in the semiconductor substrate, wherein the hole exposes the conducting pad structure; and
a conducting structure disposed on the second surface of the semiconductor substrate and electrically connected to the conducting pad structure, wherein the conducting structure conformally extends onto a sidewall and a bottom of the hole without filling the hole.

9. A method for forming a chip package, comprising:
providing a semiconductor substrate having a first surface and a second surface, wherein a device region is formed in the semiconductor substrate;
disposing a dielectric layer and a conducting pad structure on the first surface of the semiconductor substrate, wherein the conducting pad structure is located in the dielectric layer and completely covered by a lower surface of the dielectric layer;

disposing an optical element on the lower surface of the dielectric layer;

forming a hole in the semiconductor substrate to expose the conducting pad structure; and forming a conducting structure on the second surface of the semiconductor substrate, wherein the conducting structure conformally extends onto a sidewall and a bottom of the hole without filling the hole, and electrically contacts with the conducting pad structure.

10. The method for forming a chip package as claimed in claim 9, wherein the optical element comprises a light filter film, a microlens, or combinations thereof.

11. The method for forming a chip package as claimed in claim 9, further comprising a transparent substrate disposed on the lower surface of the dielectric layer.

12. The method for forming a chip package as claimed in claim 11, further comprising a spacer layer disposed between the lower surface of the dielectric layer and the transparent substrate.

13. The method for forming a chip package as claimed in claim 9, not comprising removing a portion of the dielectric layer from a surface of the dielectric layer away from the semiconductor substrate such that the conducting pad structure is exposed.

14. The chip package as claimed in claim 8, wherein the optical element comprises a light filter film, a microlens, or combinations thereof.

15. The chip package as claimed in claim 8, further comprising a transparent substrate disposed on the lower surface of the dielectric layer.

16. The chip package as claimed in claim 15, further comprising a spacer layer disposed between the lower surface of the dielectric layer and the transparent substrate.

17. The method for forming a chip package as claimed in claim 6, wherein the optical element comprises a light filter film, a microlens, or combinations thereof.

18. The method for forming a chip package as claimed in claim 6, further comprising a transparent substrate disposed on the lower surface of the dielectric layer.

19. The method for forming a chip package as claimed in claim 18, further comprising a spacer layer disposed between the lower surface of the dielectric layer and the transparent substrate.

20. The method for forming a chip package as claimed in claim 6, further comprising a hole located in the semiconductor substrate, wherein the hole exposes the conducting pad structure, the conducting structure extends into the hole to electrically contact with the conducting pad structure, and the conducting structure is separated from the semiconductor substrate by an insulating layer.

* * * * *